US012796004B2

(12) United States Patent
Wang et al.

(10) Patent No.: US 12,796,004 B2
(45) Date of Patent: Nov. 10, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Jer-Fu Wang, Taipei City (TW); Hung-Li Chiang, Taipei City (TW); Goutham Arutchelvan, Hsinchu County (TW); Wei-Sheng Yun, Taipei City (TW); Chao-Ching Cheng, Hsinchu City (TW); Iuliana Radu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 440 days.

(21) Appl. No.: 18/452,584

(22) Filed: Aug. 21, 2023

(65) Prior Publication Data

US 2025/0072058 A1 Feb. 27, 2025

(51) Int. Cl.

| | |
|---|---|
| ***H10D 30/67*** | (2025.01) |
| ***H10D 30/43*** | (2025.01) |
| ***H10D 62/10*** | (2025.01) |
| ***H10D 62/80*** | (2025.01) |
| ***H10D 64/62*** | (2025.01) |
| ***H10D 99/00*** | (2025.01) |

(52) U.S. Cl.

CPC ......... *H10D 30/6757* (2025.01); *H10D 30/43* (2025.01); *H10D 30/6729* (2025.01); *H10D 30/6735* (2025.01); *H10D 62/121* (2025.01); *H10D 62/80* (2025.01); *H10D 64/62* (2025.01); *H10D 99/00* (2025.01); *H10D 62/882* (2025.01)

(58) Field of Classification Search

CPC ............. H10D 30/6757; H10D 30/017; H10D 30/6735; H10D 30/43; H10D 30/6729; H10D 99/00; H10D 62/121; H10D 62/80; H10D 62/882; H10D 64/62

USPC .......................................................... 257/401

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Tu-Tu V Ho
(74) *Attorney, Agent, or Firm* — JCIPRNET

(57) ABSTRACT

A semiconductor device structure and a manufacturing method thereof are provided. The semiconductor device structure includes a substrate, complex two-dimensional material layers disposed over the substrate, a gate structure and source and drain regions. The complex two-dimensional material layers are arranged spaced apart from one each other and in parallel to one another. The gate structure is disposed across and wraps around and surrounds first portions of the complex two-dimensional material layers. The source and drain regions are disposed on opposite sides of the gate structure and wrap around and surround second portions of the complex two-dimensional material layers.

20 Claims, 15 Drawing Sheets

(56) References Cited

U.S. PATENT DOCUMENTS

| | | | | |
|---|---|---|---|---|
| 9,608,116 | B2 | 3/2017 | Ching et al. | |
| 2023/0008409 | A1 * | 1/2023 | Chou | H10D 62/118 |

* cited by examiner

SEMICONDUCTOR DEVICE AND MANUFACTURING METHOD THEREOF

BACKGROUND

Continuously scaling down and high integration density of semiconductor devices such as transistors have increased the complexity of semiconductor manufacturing processes.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 5A are schematic top views showing various stages in a manufacturing method of a stacked structure in accordance with some embodiments of the disclosure.

FIG. 1B to FIG. 5B are schematic cross-sectional views of FIG. 1A to FIG. 5A along cross-sectional lines A-A' or B-B'.

DETAILED DESCRIPTION

Figure 1B:
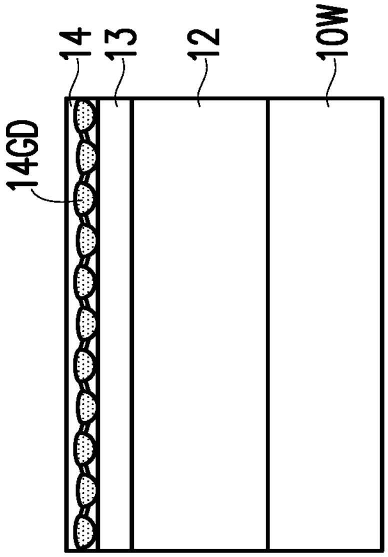

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure. Source/drain region(s) may refer to a source or a drain, individually or collectively dependent upon the context.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the structure(s) formed with one or more semiconductor devices such as transistors and the integrated structures fabricated there-from. Certain embodiments of the present disclosure are related to the structures including semiconductor transistors and/or other elements. The substrates and/or wafers may include one or more types of integrated circuits or electronic components therein. The semiconductor device(s) may be formed on a bulk semiconductor substrate or a silicon/germanium-on-insulator substrate.

The present disclosure describes semiconductor devices, such as field-effect transistors (FETs), such as planar FETs, fin-type FETs (FinFETs), nano-sheet transistors, or gate all around (GAA) transistors.

Two-dimensional (2D) materials include graphene, hexagonal boron nitride (h-BN), black phosphorus and transition metal dichalcogenides (TMDs). Graphene offers remarkable properties such as high charge-carrier mobility, high thermal conductivity, high optical activity, high mechanical strength, and low Young's modulus. Graphene is composed of a single layer of carbon atoms arranged in a two-dimensional (2D) honeycomb lattice. Among the 2D materials, TMDs have the chemical formula $MX_2$, where M is a transition metal such as molybdenum (Mo) or tungsten (W) and X is a chalcogen such as sulfur (S), selenium (Se) or tellurium (Te). For TMDs having various crystal structures, the most common crystal structure is the 2H-phase with trigonal symmetry, which results in semiconducting characteristics (e.g. $MoS_2$, $WS_2$, $MoSe_2$ or $WSe_2$). TMDs may be formed of monolayers bound to each other by Van-der-Waals attraction, and TMD monolayer(s) may be used in electronic devices such as TMD-based field-effect transistors (TMD-FETs).

The present disclosure describes the formation of a stacked structure stacking with composite channel material layers. The present disclosure describes a semiconductor device formed with self-defined 2D channel material layer (s). Also, the present disclosure describes a semiconductor device with dual 2D material layers or complex 2D material layers embedded within the source and drain regions.

FIG. 1A to FIG. 5A are schematic top views showing various stages in a manufacturing method of a stacked structure in accordance with some embodiments of the disclosure. FIG. 1B to FIG. 4B are schematic cross-sectional views of FIG. 1A to FIG. 4A along the cross-sectional line A-A', while FIG. 5B is a schematic cross-sectional view of FIG. 5A along the cross-sectional line B-B'.

Figure 1A:
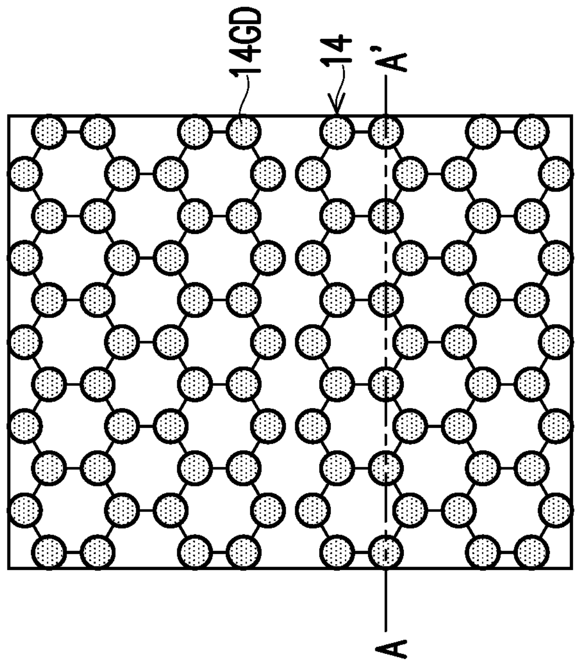

Referring to FIG. 1A and FIG. 1B, in some embodiments, a substrate 10W having an overlayer 12 thereon is provided. In some embodiments, a first sacrificial material layer 13 is formed on the overlayer 12. Later, in some embodiments, a first 2D material layer 14 is formed on the first sacrificial material layer 13. From FIG. 1A to FIG. 5B, only a portion of the substrate 10W is shown, and only a portion of the device region of the stacked structure 10K is shown for illustration purposes.

Referring to FIG. 1A and FIG. 1B, in some embodiments, the substrate 10W includes a semiconductor substrate. In one embodiment, the substrate 10W comprises a bulk semiconductor substrate such as a crystalline silicon substrate in a wafer from, and may be doped (e.g., p-type or n-type semiconductor substrate) or undoped. In one embodiment, the substrate 10W comprises a silicon-on-insulator substrate or a germanium-on-insulator substrate. In certain embodiments, the substrate 10W includes one or more doped regions or various types of doped regions doped with p-type and/or n-type dopants. For example, the p-type dopants are boron, indium, aluminum, or gallium, and the n-type dopants are phosphorus or arsenic. In some embodiments, the substrate 10W includes a semiconductor substrate made of other suitable elemental semiconductor, such as diamond or germanium; a suitable compound semiconductor, such as gallium arsenide (GaAs), silicon carbide (SiC), indium arsenide (InAs), or indium phosphide (InP); or a suitable alloy semiconductor, such as silicon-germanium (SiGe), gallium arsenic phosphide (GaAsP), or gallium indium phosphide (GaInP). In some embodiments, the substrate 10W includes an oxide semiconductor material such as indium tin oxide (ITO). It is understood that different types of substrates, such as single-layer, multi-layered, or gradient substrates may be used. In some embodiments, the overlayer 12 includes or is a dielectric layer.

In FIG. 1A and FIG. 1B, in some embodiments, the first sacrificial material layer 13 includes or is a dielectric material layer. In some embodiments, the dielectric material includes oxides such as silicon oxide, silicon oxynitride or nitrides such as silicon nitride. In some embodiments, the dielectric material is formed by chemical vapor deposition (CVD), atomic layer deposition (ALD) or other suitable deposition technology. In some embodiments, the first sacrificial material layer 13 includes or is a semiconductor material layer including silicon. In one embodiment, the material of the first sacrificial material layer 13 includes other semiconductor materials such as diamond or germanium, a suitable compound semiconductor (such as gallium arsenide, silicon carbide, indium arsenide, or indium phosphide), or a suitable alloy semiconductor (such as silicon germanium carbide, gallium arsenic phosphide, or gallium indium phosphide). In some embodiments, the semiconductor material is formed by epitaxy growth such as vapor phase epitaxy (VPE), molecular beam epitaxy (MBE), CVD such as hybrid physical-chemical vapor deposition (HPCVD), ALD, or the like. The material of the first sacrificial material layer 13 is different from the material of the later-formed above layer and may be removed or replaced (sacrificed) in later gate formation process.

In some embodiments, the first 2D material layer 14 is formed as a single layer (one or few monolayers in atomic scale) of atoms 14GD of the first 2D material. In some embodiments, the first 2D material includes crystalline graphene, and the first 2D material layer 14 is formed as a single layer of graphene. Taking graphene as an example, the monolayer of graphene is shown in the schematic top view of FIG. 1A as a monolayer of carbon atoms arranged in a hexagonal shape. In some embodiments, the first 2D material layer 14 is formed through performing a CVD process. In one embodiment, the first 2D material layer 14 is formed by forming one or a few monolayers of crystalline graphene on a copper-based substrate through CVD and then transferred the monolayer of graphene onto the first sacrificial material layer 13. In some embodiments, the formation of the first 2D material layer 14 includes forming crystalline graphene by chemical or mechanical exfoliation and then transferred onto the first sacrificial material layer 13.

Figure 2A:
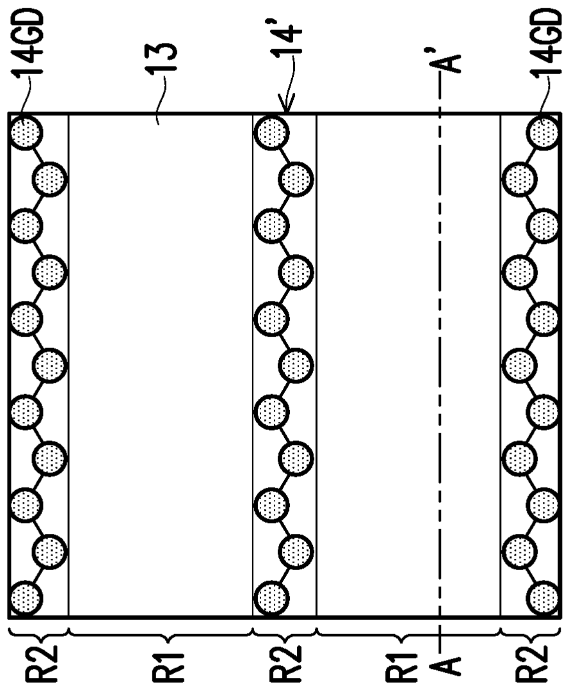
Figure 2B:
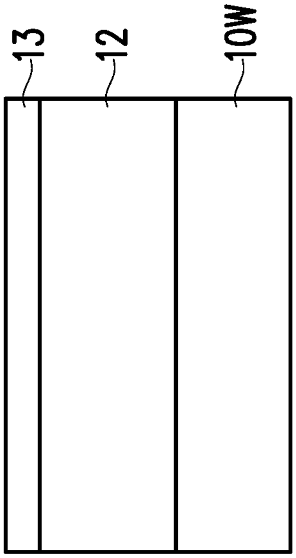

Referring to FIG. 2A and FIG. 2B, the first 2D material layer 14 is patterned to remove portions of the first 2D material layer 14 in first regions R1 to expose the underlying first sacrificial material layer 13. In some embodiments, the first regions R1 are active regions predetermined for forming channel regions in subsequent processes. In some embodiments, the patterning process includes forming a photoresist pattern (not shown) with openings over the first 2D material layer 14, and performing an etching process to remove the first 2D material layer 14 exposed by the openings to form the patterned first material layer 14'. For example, the etching process may be any acceptable etching process, such as dry etching, a reactive ion etching (RIE), neutral beam etching (NBE), inductively coupled plasma etching (ICP), ion-beam etching (IBE), or a combination thereof. For example, the openings of the photoresist pattern are formed with the outlines or shapes defining the later-formed channel regions and formed at locations corresponding to the later-formed channel regions, and after performing the patterning process, the remained first material layer 14' mainly covers the second regions R2 for forming source and drain regions in the subsequent processes.

Figure 3A:
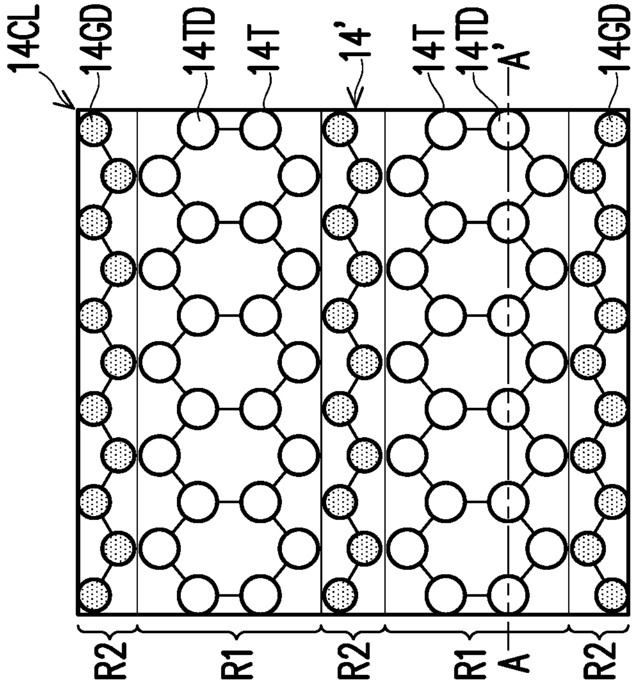
Figure 3B:
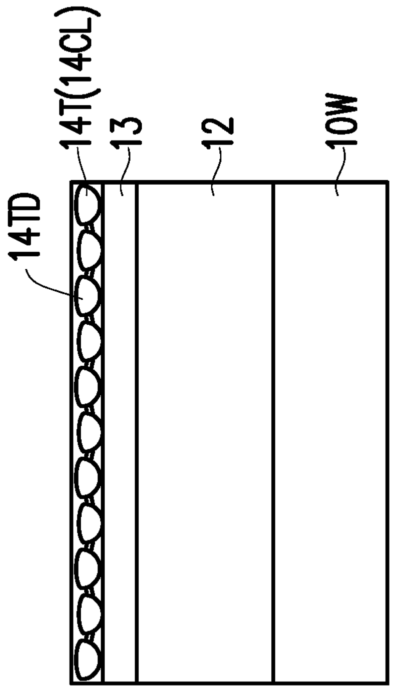

Referring to FIG. 3A and FIG. 3B, using the remained first 2D material layer 14' in the second region R2 as a pattern, a second 2D material 14T is formed within the first regions R1 to form a first complex 2D material layer 14CL. In some embodiments, using the first 2D material (e.g. the monolayer of graphene) as the template for assisting the nucleation and orientation of the second 2D material 14T, the second 2D material 14T is selectively grown within the first regions R1 fully covering the whole areas of the first regions R1 to form the first complex 2D material layer 14CL. That is, the second 2D material is formed on-site under the assistance of the first 2D material, and formed within the specific areas defined and limited by the pattern of the first 2D material, and the second 2D material is grown and integrated with the first 2D material to form a layer of a complex 2D material (complex 2D material layer). That is, the formation of the complex 2D material, especially the second 2D material (such as TMDs), occurs on the same exposed surface within the same region (on-site). Compared with the transferring method, the 2D material monolayer or thin film formed through the process steps described herein can be formed into stacked structures and specifically limited within certain regions.

Referring to FIG. 3A and FIG. 3B, in some embodiments, the second 2D material 14T includes crystalline transition metal dichalcogenide (TMD), and the second 2D material 14T is formed as a single layer of TMD. TMDs have the chemical formula $MX_2$, where M is a transition metal such as molybdenum (Mo) or tungsten (W) and X is a chalcogen such as sulfur (S), selenium (Se) or tellurium (Te). In some embodiments, the second 2D material 14 includes $MoS_2$, $WS_2$, $MoSe_2$ or $WSe_2$. In one embodiment, the second 2D material 14 includes $MoS_2$ or $WS_2$. Using the monolayer of graphene as the template, the pattern-specific or area-selective growth of TMD is shown in the schematic top view of FIG. 3A as atoms 14TD of TMD arranged in a hexagonal shape and combined with the graphene. In some embodiments, the formation of the second 2D material layer 14 involves performing a CVD process such as a furnace CVD process. In embodiments, the CVD process is a selective CVD process specially assisted under the template or pattern of a 2D material. With the presence of the first 2D material (such as graphene), the materials or the properties of the underlying surface is not essential or critical for the reaction/formation of the second 2D material (such as TMDs), which significantly enhances the flexibility of material choices. In selective CVD, the selectivity of deposition may be obtained through the chemical behaviors of reactants, and the advantage of selective CVD is the self-alignment and self-limitation with respect to the template pattern, which allows for selective deposition of the 2D material under tight design-rules in the production of transistors or semiconductor devices.

Using the monolayer of the first 2D material (e.g. graphene) as the template, another 2D material (such as TMD) can be formed as a monolayer (or a few monolayers) with the area(s) defined by the template regardless the material of the underlying layer. By doing so, the growth of TMD possibly occurs on either a surface of a dielectric material or a semiconductor material, rather than being limited onto a metal surface or sapphire substrate. According to the embodiments of this disclosure, the formation of the complex 2D material layer is compatible with either front-end-of-line (FEOL) processes or the back-end-of-line (BEOL) processes as the complex 2D material can be formed freely on any suitable material surface.

Figure 4A:
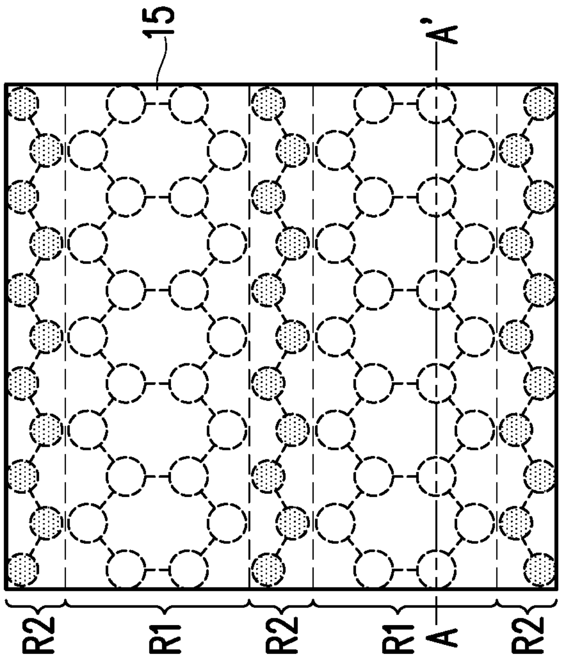
Figure 4B:
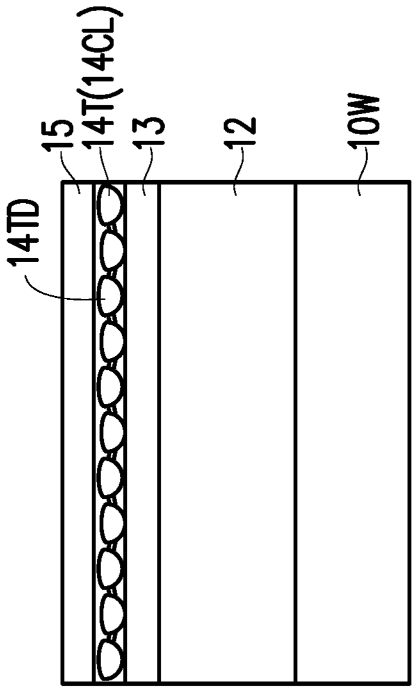

Referring to FIGS. 4A and 4B, in some embodiments, a second sacrificial material layer 15 is globally formed on the first complex 2D material layer 14CL and covers the first and second regions R1 and R2. In one embodiment, the material of the second sacrificial material layer 15 is substantially the same as the first sacrificial material layer 13, and such material has a high etching selectivity relative to the material of the first complex 2D material layer 14CL. The material(s) and the formation method(s) of the second sacrificial material layer 15 are similar to those of the first sacrificial material layer 13, and details will not be repeated again.

Figure 5B:
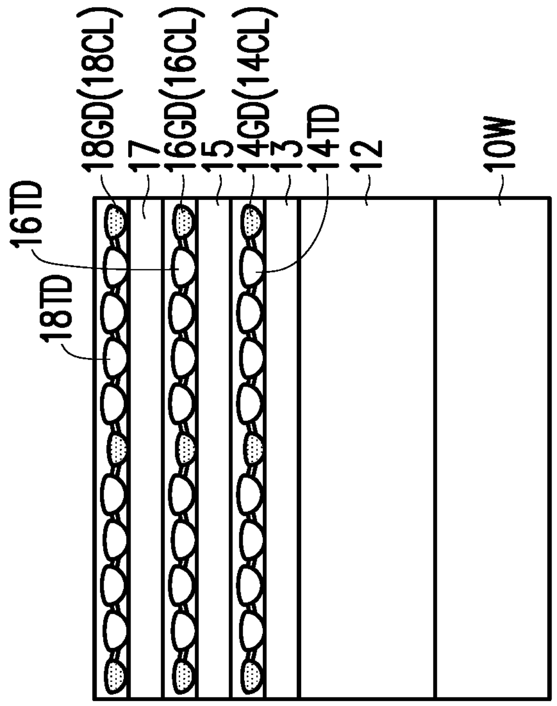
Figure 5A:
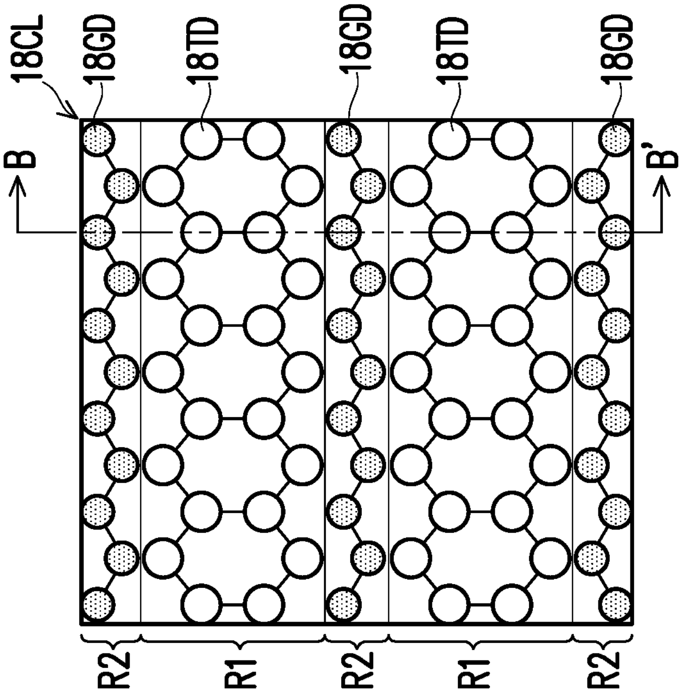

Referring to FIGS. 5A and 5B, following the repetition of the process steps as illustrated in the previous contexts and as shown from FIG. 1A to FIG. 4B, a second complex 2D material layer 16CL is formed on the second sacrificial material layer 15, a third sacrificial material layer 17 is formed on the second complex 2D material layer 16CL, and a third complex 2D material layer 18CL is formed on the third sacrificial material layer 17 sequentially, and a stacked structure 10K is formed. That is, the stacked structure 10K is formed by forming sacrificial material layers 13, 15, 17 and complex 2D material layers 14CL, 16CL and 18CL in alternation. The material(s) and the formation method(s) of the second and third complex 2D material layers 16CL, 18CL are similar to those of the first complex 2D material layer 14CL, and the details are omitted herein for simplicity. The material(s) and the formation method(s) of the third sacrificial material layer 17 are similar to those of the first or second sacrificial material layer 13 or 15, and details are omitted for simplicity. It is understood that the number or quantities of the stacking layers are not limited by the descriptions or figures herein. In some embodiments, the second complex 2D material layer 16CL includes atoms 16GD of the first 2D material formed in the second region R2 and atoms 16TD of the second 2D material formed within the first regions R1. In some embodiments, the third complex 2D material layer 18CL includes atoms 18GD of the first 2D material formed in the second region R2 and atoms 18TD of the second 2D material formed within the first regions R1. Through the layout arrangement, the first regions R1 and the second regions R2 of the complex 2D material layers 14CL, 16CL and 18CL are vertically aligned and fully overlapped.

In one embodiment, the stacked structure 10K includes multiple fin stacks that will be later patterned and trench isolation structures that are later formed and defined in later semiconductor manufacturing processes. The stacked structure 10K is shown with only a portion including one fin stack in FIG. 5A and FIG. 5B for easy illustration. It is understood that even only a portion of the stacked structure is shown for illustration purposes, but multiple fin stacks formed within the stacked structure 10K are encompassed within the scope of this disclosure.

FIG. 6 to FIG. 14 are schematic cross-sectional views showing various stages in a manufacturing method of a semiconductor device 10 in accordance with some embodiments of the disclosure. The cross-sectional line cutting through one fin stack along the extending direction (X-direction) of the fin stack(s) to provide the schematic cross-sectional views for illustration purposes. Particularly, FIG. 6 to FIG. 14 illustrate exemplary manufacturing processes for forming gate all around (GAA)/nanosheet transistors. Other process steps and combinations of process steps can be utilized without departing from the scope of the present disclosure.

Figure 6:
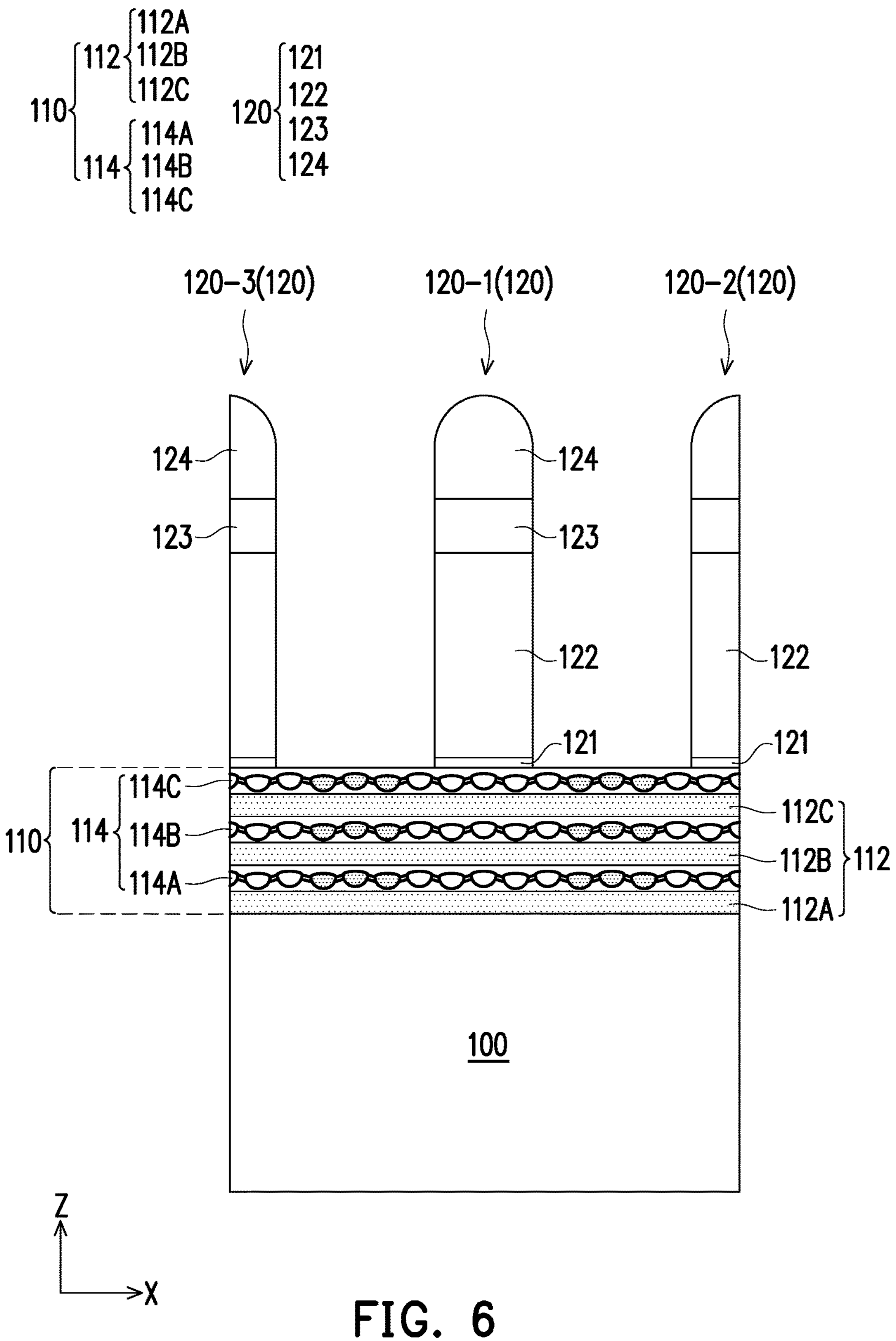
FIG. 6 to FIG. 14 are schematic cross-sectional views showing various stages in a manufacturing method of a semiconductor device in accordance with some embodiments of the disclosure.

Referring to FIG. 6, the stack 110 formed over the substrate 100 is provided. In some embodiments, the substrate 100 is similar to the substrate 10W, and the stack 110 is similar to the stacked structure 10K as described in the previous paragraphs, and similar materials and formation methods are applicable for these layers or parts.

In some embodiments, referring to FIG. 6, the stack 110 includes alternating layers of sacrificial material layers 112A-112C (collectively referred to as sacrificial material layers 112) and complex 2D material layers 114A-114C (collectively referred to as complex 2D material layers 114). In some embodiments, the sacrificial material layers 112A-112C (sacrificial material layers 112) are formed of substantially the same sacrificial material, and the complex 2D material layers 114A-114C (complex 2D material layers 114) are formed of the same complex 2D material. In some embodiments, the material of the sacrificial material layers 112 is different from the material(s) (the complex 2D material) of the complex 2D material layers 114, and high etching selectivity exists between the materials of the complex 2D material layers 114 and the sacrificial material layers 112. In some embodiments, the sacrificial material layers 112 may include silicon nitride or silicon, and the complex 2D material layers 114 include graphene and TMD.

Referring to FIG. 6, dummy structures 120 (including the dummy structures 120-1, 120-2 and 120-3) are formed on the stack 110. In some embodiments, each dummy structure 120 include a lining layer 121, a material layer 122, a hard mask 123 and a cap mask 124 sequentially stacked from bottom to top. For example, the formation of the dummy structures 120 involves forming the lining layer 121 of an oxide material by thermal oxidation, forming the material layer 122 by depositing a polysilicon layer, forming the hard mask 123 and the cap mask 124 by depositing a silicon nitride layer and a masking material, and then patterning the whole stack through photolithography and etching processes. In some embodiments, several parallel dummy structures are formed over and across over multiple parallel fin stacks, as the extending direction of the dummy structures is intersected with the extending direction of the fin stacks. In some embodiments, the patterning may include one or more suitable etching processes, such as anisotropic etching processes. In some embodiments, the etching processes include reactive ion etch (RIE), neutral beam etch (NBE), or a combination thereof.

Figure 7:
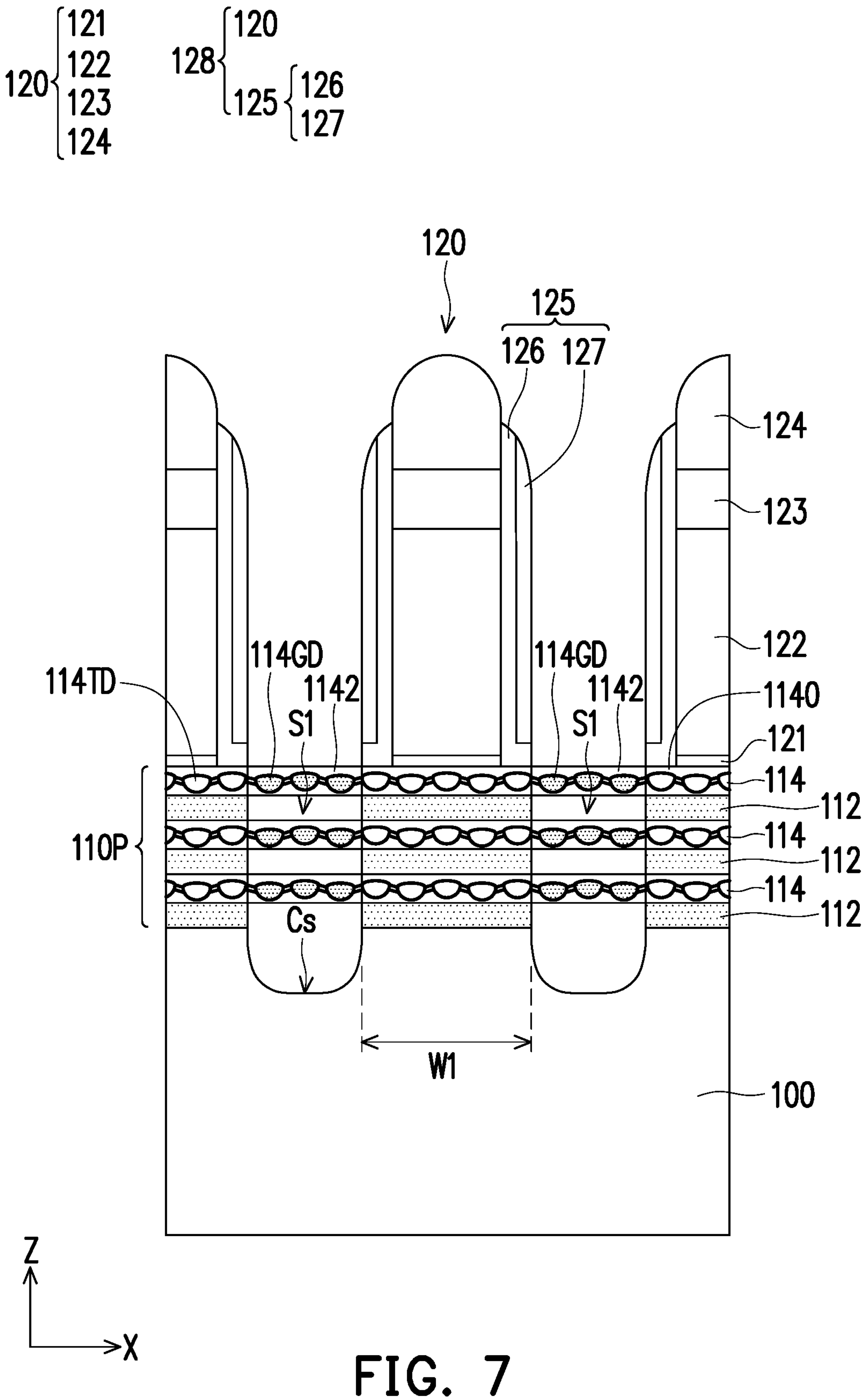

Referring to FIG. 7, sidewall spacers 125 along the sidewalls of the dummy structures 120 are formed. In some embodiments, the sidewall spacers 125 are formed by conformally depositing a first spacer material and then a second spacer material over the dummy structures 120 and then etching back the first and second spacer materials until the cap mask 124 is exposed. As seen in FIG. 7, the gate spacer(s) includes a double-layered structure of an inner spacer 126 and an outer spacer 127. In one embodiment, the material(s) of the sidewall spacers 125 include silicon nitride, silicon carbide (SiC), silicon carbonitride (SiCN) or silicon oxycarbon nitride (SiOCN). In one embodiment, the material(s) of the inner spacer(s) 126 of the sidewall spacers 125 include SiOCN, and the material(s) of the outer spacer 127 includes silicon nitride (SiN) or silicon carbide (SiC). In one embodiment, the material(s) of the inner spacer(s) 126 of the sidewall spacers 125 include SiOCN, and the material (s) of the outer spacer 127 includes SiOCN. In alternative embodiments, the sidewall spacers 125 may be single-layered structure or a three-layered structure or more layered structures. In some embodiments, as seen in FIG. 7, the combined structure 128 of the dummy structure 120 along with the sidewall spacers 125 located on the stack 110 defines the channel regions and has a width W1 (along the X-direction of the fin stack). In some embodiments, the composite structures 128 of the dummy structures 120 along with the spacers 125 are shown in the figures to have substantially vertical sidewalls. However, it is understood that the sidewall profiles of the spacers or other structures may be fine-tuned and not necessarily have vertical sidewalls.

In FIG. 7, using the composite structure 128 of the dummy structure 120 and the sidewall spacers 125 on the fin stacks 110 as the masking patterns, the stack(s) 110 is patterned into multiple stacks 110P. That is, using the composite structure 128 of the dummy structure 120 and the sidewall spacers 125 as masks, the sacrificial material layers 112 are removed (etched off) while the complex 2D material layers 114 in the respective stack 110 are not etched and remained. In some embodiments, the etching process includes one or more anisotropic etching processes. As the materials of the sacrificial material layers 112 and the complex 2D material layers 114 are different, the etching process may include more than one or a series of etching processes using different etching recipes to have etch selectivity toward the sacrificial material. In some embodiments, during the patterning process, the stack(s) 110 is patterned into the patterned fin stacks 110P with openings S1 therebetween, and the substrate 100 may be further etched to form cavities Cs in the substrate 100. For certain etching processes, due to high etch selectivity between the materials, the sacrificial material layers 112 are etched or removed without significantly removing the complex 2D material of the complex 2D material layers 114. Due to the material characteristics of the complex 2D material, the complex 2D material layers 114 are remained as integral layers with portions 1142 of the complex 2D material layers 114 are overhung over the openings S1 and are exposed (not covered by the sacrificial material layers 112).

In some embodiments, as described in the previous contexts, each of the complex 2D material layers 114 includes at least two different types of 2D materials joined to become the complex 2D material. In some embodiments, each complex 2D material layer 114 includes first portions 1140 containing atoms 14TD of a TMD material and located within the predetermined regions corresponding to the channel regions and second portions 1142 containing atoms 14GD of graphene and located within the predetermined regions corresponding to source and drain regions. After the patterning process and forming the stacks 110P, the channel regions located under the dummy structures 120 are defined, while the portions 1142 of the complex 2D material layers 114 containing graphene are defined and exposed.

In embodiments, the sacrificial material layers 112 of the stack(s) 110P have the substantially the same width W1 as the above composite structure 128 (the dummy structure 120 along with the sidewall spacers 125). In some embodiments, the openings S1 between the patterned fin stacks 110P are shown in the figures to have substantially vertical sidewalls, so that the sacrificial material layers 112 have substantially the same length/width. However, it is possible that the fin stack(s) 110 or the openings S1 may have tapered sidewalls, such that a length/width of each of the sacrificial material layers 112 may continuously increase in a direction towards the substrate 100.

Figure 8:
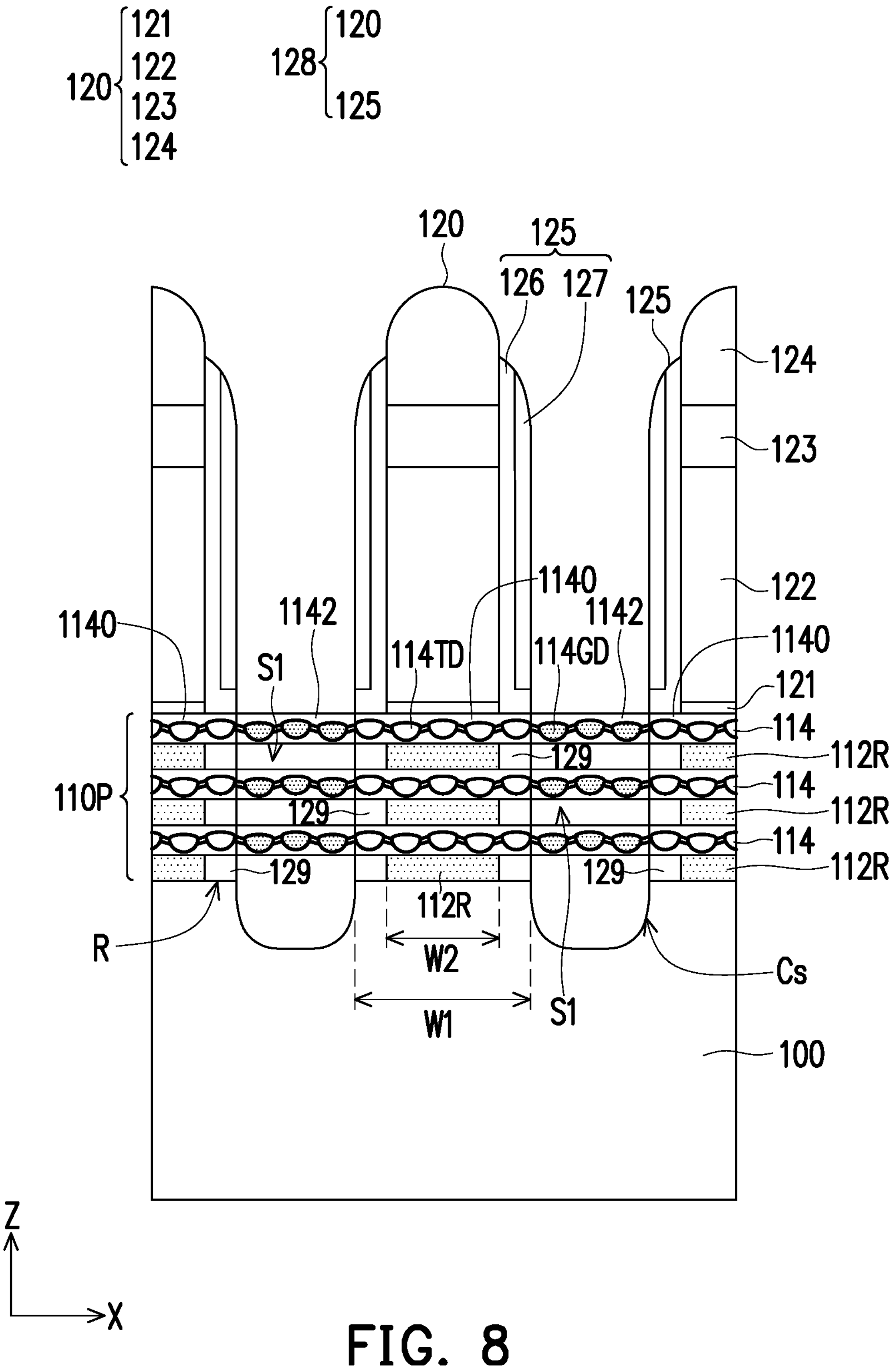

In FIG. 8, a lateral etching process is performed to the patterned fin stacks 110P through the openings S1, the sacrificial material layers 112 of the patterned fin stacks 110P are laterally etched to form recessed sacrificial material layers 112R with side recesses R at opposite sides of the recessed sacrificial material layers 112R and between the complex 2D material layers 114. In FIG. 8, in some embodiments, the etching process has been performed to laterally recess the sacrificial material layers 112, and the recesses sacrificial material layers 112R has a width W2 with respect to the complex 2D material layers 114.

In some embodiments, the lateral etching process may include a wet etching process by using a chemical bath with etchant(s) that selectively etches the sacrificial material layers 112 with respect to the complex 2D material layers 114. For example, the wet etching process is timed so that the sacrificial material layers 112 are recessed but not entirely removed. For the lateral etching process, due to high etch selectivity between the materials, the sacrificial material layers 112 are etched or recessed without significantly removing the complex 2D material layers 114.

In FIG. 8, in some embodiments, the first portions 1140 of the complex 2D material layers 114 that are located right below the composite structures 128 function as channel regions and have substantially the same width W1 (i.e. channel width), and the width W1 is larger than the width W2 of the recessed sacrificial material layers 112R.

Referring to FIG. 8, in some embodiments, lateral spacers 129 are formed in the recesses R at opposite sides of the recessed sacrificial material layers 112R and between the above and below complex 2D material layers 114. In some embodiments, the formation of the lateral spacers 129 includes depositing a spacer material such as silicon nitride by an ALD process, a CVD process, or other suitable processes into the recesses R and then performing at least one etching process to remove the extra spacer material by utilizing the sidewall spacers 125 as masks. In FIG. 8, the lateral spacers 129 are located directly below the sidewall spacers 125, and the outer sidewalls of the lateral spacers 129 and the sidewall spacers 125 are almost vertically aligned. In some embodiments, the thickness of the sidewall spacer(s) 125 is larger than the thickness of the lateral spacer(s) 129.

Figure 9:
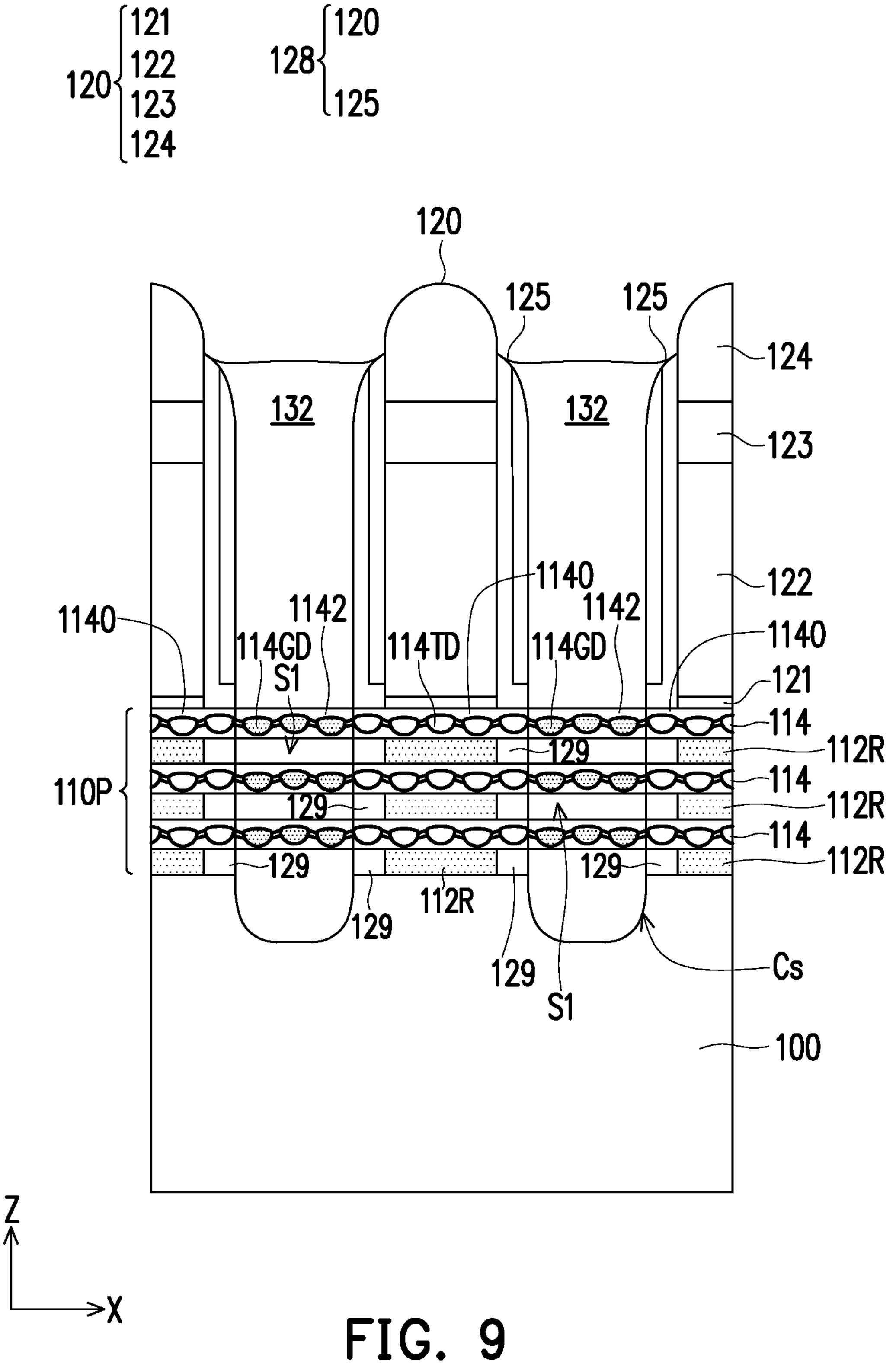

Referring to FIG. 8 and FIG. 9, an interlayer dielectric (ILD) layer 132 is formed over the substrate 100 filling into the space between the composite structures 128 and filling up the openings S1 and cavities Cs (see FIG. 8). In some embodiments, the ILD layer 132 is formed to cover the composite structures 128. In some embodiments, the ILD layer 132 covers and wraps the exposed portions (overhung portions) 1142 of the complex 2D material layers 114, and the atoms 114GD (e.g. graphene) of the portions 1142 are embedded within the ILD layer 132. In some embodiments, the ILD layer 132 at least covers the sidewall spacers 125 but exposes tops of the dummy structures 120. In some embodiments, the ILD layer 132 includes more than one layers of dielectric materials, and the ILD layer 132 may include one or more layers of silicon oxide materials and one layer of silicon nitride as an etch stop layer. In some embodiments, the ILD layer 132 is formed by spin-coating, CVD, ALD, or other suitable deposition processes. In some embodiments, an etching back process is optionally performed.

Figure 10:
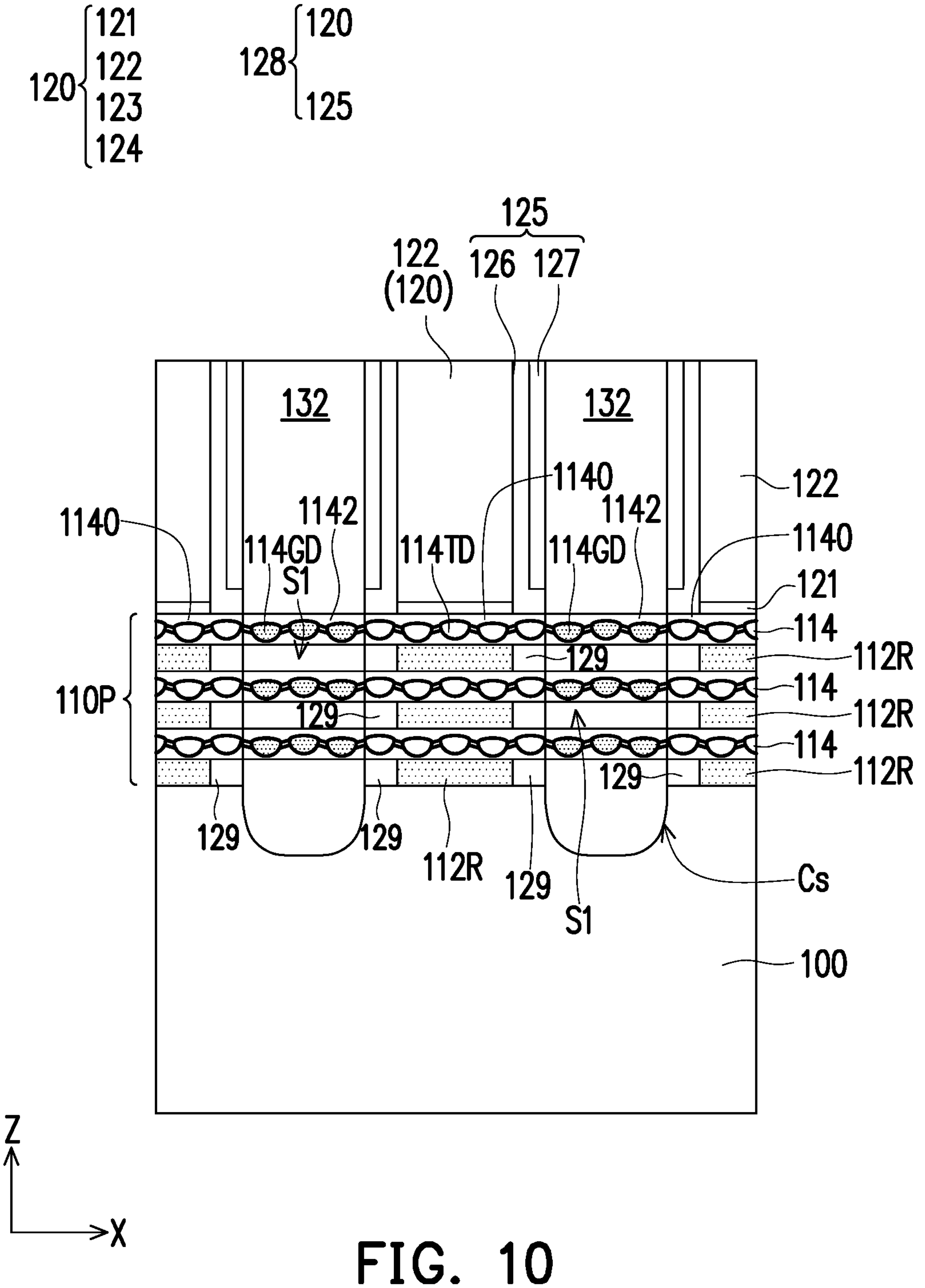

Referring to FIG. 10, in some embodiments, a planarization process is performed to partially remove the ILD layer 132 and the composite structures 128. After the planarization process, as seen in FIG. 10, portions of the ILD layer 132, portions of the sidewall spacers 125 (i.e. part of the composite structure of inner spacers 126 and outer spacers 127) and portions of the dummy structures 120 (i.e. the hard mask 123, cap mask 124 and parts of the material layer 122) are removed, and the remained structure has a coplanar top surface. As seen in FIG. 10, the material layers 122 of the dummy structures 120 are exposed with the remained sidewall spacers 125 alongside and next to the exposed material layers 122.

Figure 11:
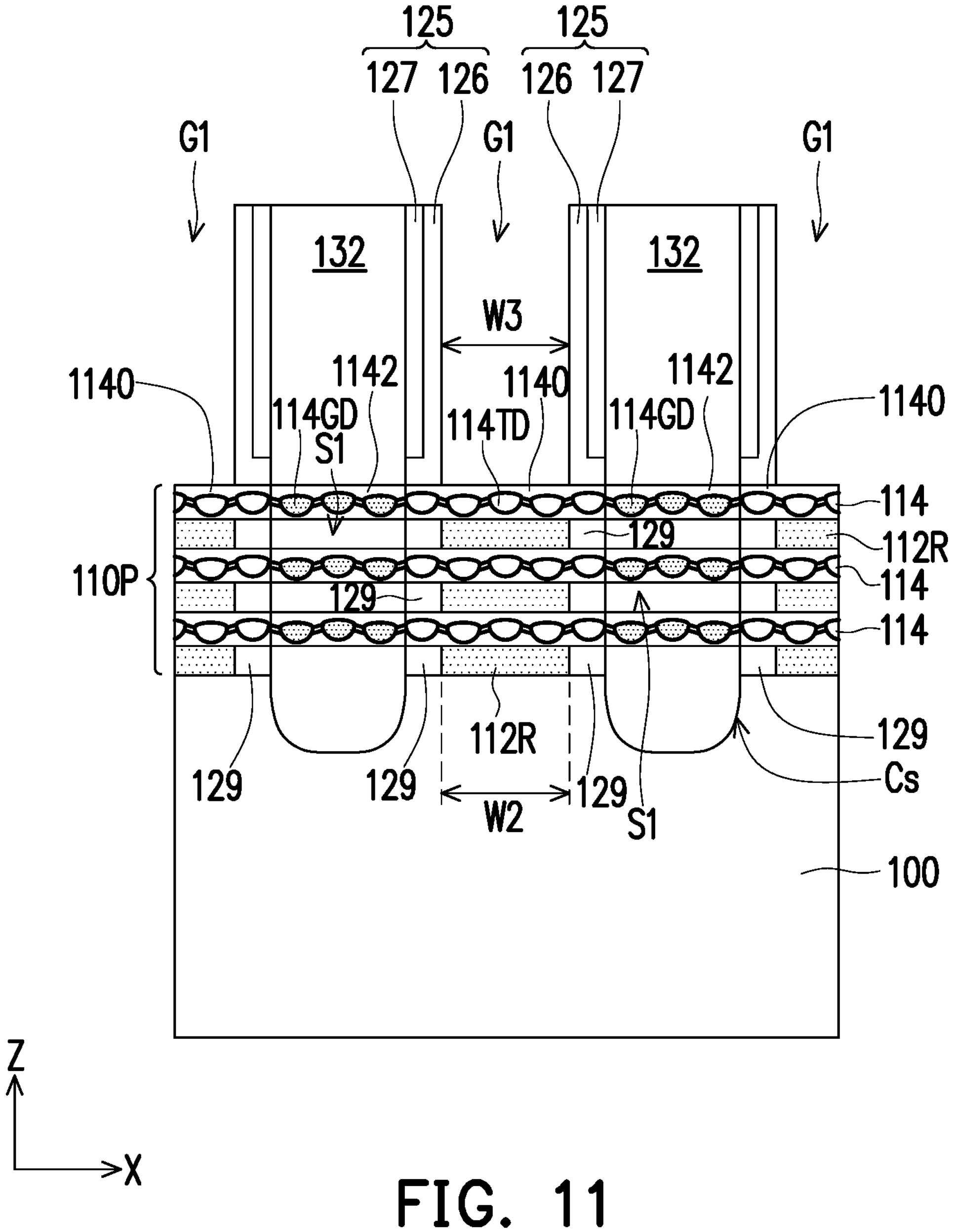

Referring to FIG. 11, in some embodiments, using the remained ILD layer 132 and the remained sidewall spacers 125 as masks, the exposed material layers 122 in the dummy structures 120 are removed. In some embodiments, the lining layers 121 in the dummy structures 120 are also removed along with the removal of the material layers 122. That is, the dummy structures 120 are removed. In some embodiments, at least one anisotropic etching process is performed to selectively etch off materials of the material layer 122 and the lining layer 121 (the remained dummy structures 120) with respect to the materials of the sidewall spacers 125.

Referring to FIG. 11, in some embodiments, the removal of the exposed dummy structures 120 results in gate trenches G1 formed between the inner spacers 126 of the sidewall spacers 125, and portions 1140 of the complex 2D material layer(s) 114 are exposed by the gate trenches G1. In some embodiments, as seen in FIG. 11, the gate trench G1 defined by the inner sidewall of the inner spacer(s) 126 has a width W3 about the same as the width W2 of the recessed sacrificial material layers 112R.

Figure 12:
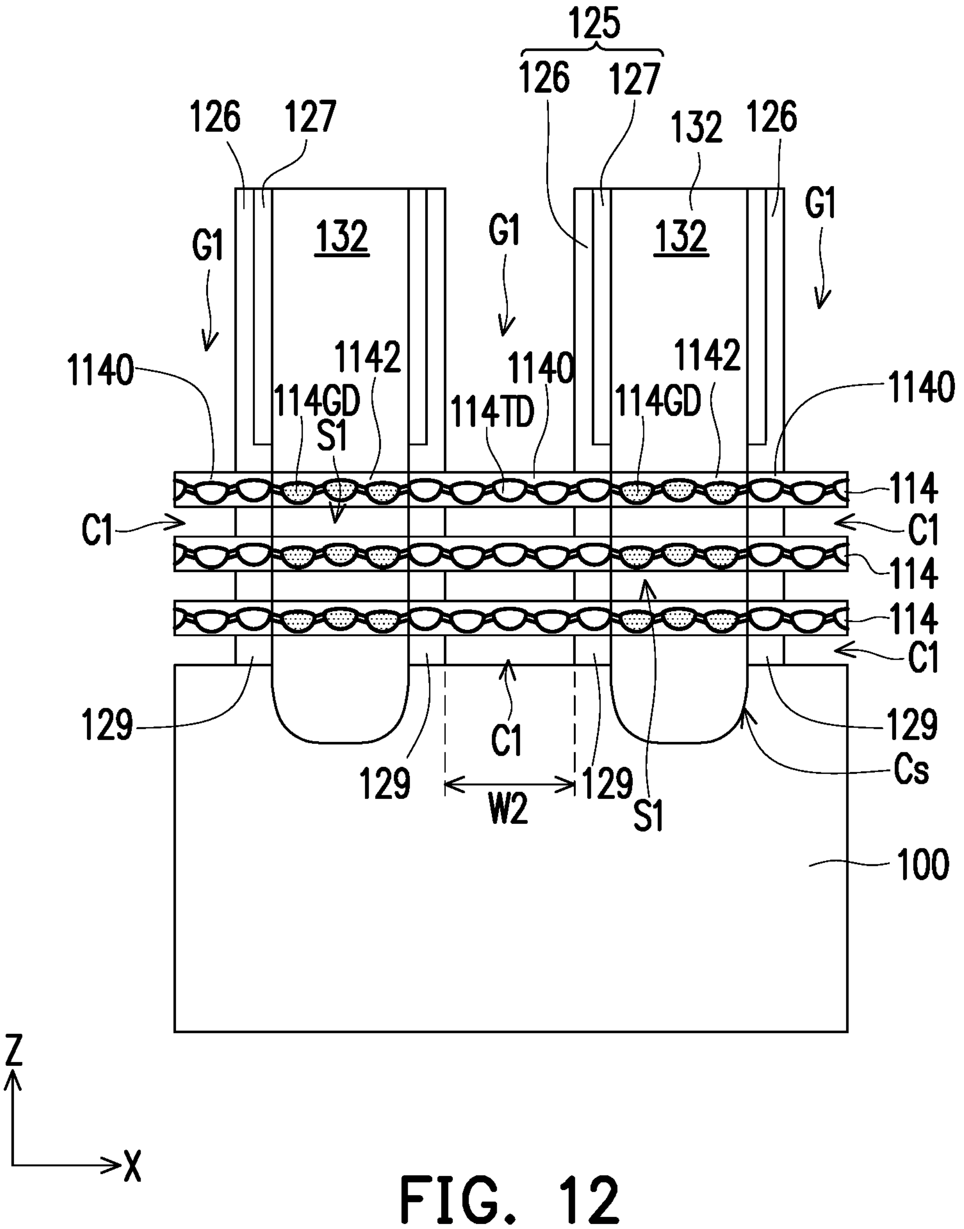

Referring to FIG. 12, in some embodiments, the recessed sacrificial material layers 112R are removed through the gate trenches G1. In some embodiments, the recessed sacrificial material layers 112R are removed through performing a specific etching process selectively etching off the corresponding sacrificial material layers 112R with respect to the material of the lateral spacers 129. In some alternative embodiments, at least one anisotropic etching process may be performed to remove the recessed sacrificial material layers 112R.

Referring to FIG. 12, in some embodiments, the removal of the recessed sacrificial material layers 112R leaves cavities C1 between the complex 2D material layers 114 (between the first portions 1140 of the above and below layers 114). As the cavities C1 are formed by removing the recessed sacrificial material layers 112R, the cavities C1 have substantially the same width W2. Based on the layout design, the gate trench(es) G1 and the below cavities C1 may be adjoining and contiguous with each other.

Figure 13:
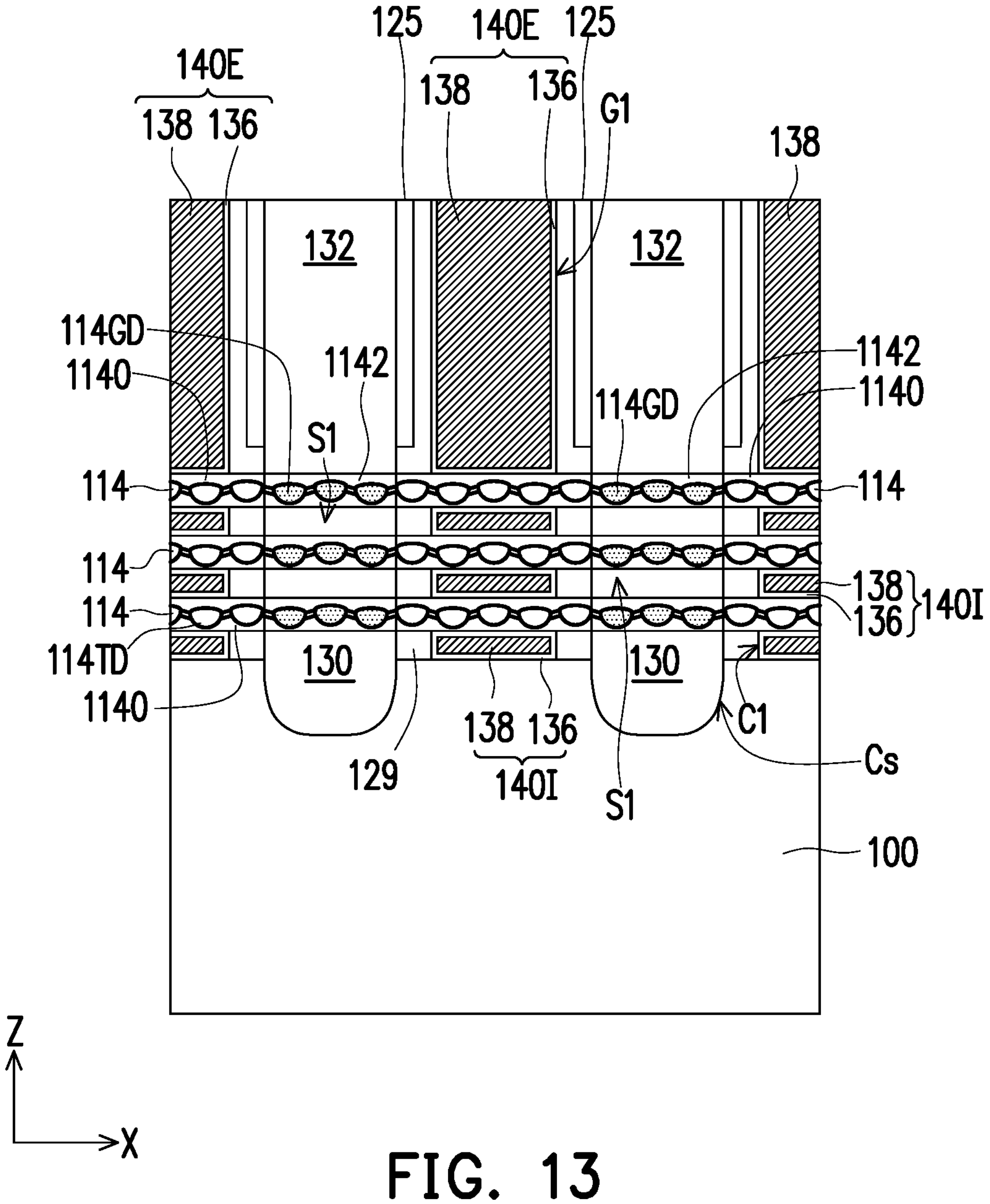

Referring to FIG. 12 and FIG. 13, in some embodiments, a high-k dielectric layer 136 is formed over the substrate 100 over the sidewall spacers 125. In some embodiments, the high-k dielectric layer 136 conformally covers exposed surfaces of the gate trenches G1 and the cavities C1. In some embodiments, the high-k dielectric layer 136 is deposited directly on and all over the exposed surfaces of the gate trenches G1 and deposited directly on the exposed surfaces of the cavities C1. That is, the exposed surfaces of the complex 2D material layers 114 (i.e. channel regions) are fully covered by the high-k dielectric layer 136. In some embodiments, the complex 2D material layers 114 have the shape like thin sheets and may be referred as nanosheets. In some embodiments, the complex 2D material layers 114 are arranged in parallel to one another and are spaced apart from the adjacent ones.

Referring to FIG. 13, in some embodiments, the high-k dielectric layer 136 formed directly on and all over the exposed surfaces of the gate trenches G1 is located directly on the facing sidewalls of the sidewall spacers 125, and the high-k dielectric layer 136 formed directly on the exposed surfaces of the cavities C1 is located directly on the sidewalls of the lateral spacers 129. In some embodiments, the high-k dielectric layer 136 wraps around the first portions 1140 of the complex 2D material layers 114.

In some embodiments, the high-k dielectric layer 136 corresponds to a gate dielectric layer of the transistor(s). For example, the high-k dielectric layer 136 includes one or more layers of a high-k dielectric material, such as hafnium dioxide ($HfO_2$), HfSiO, HfSiON, HfTaO, HfTiO, HfZrO, zirconium oxide, yttrium oxide ($Y_2O_3$), titanium oxide, aluminum oxide, aluminum oxide-based dielectric material, or other suitable high-k dielectric materials, and/or combinations thereof. In some embodiments, the high-k dielectric layer 136 may be formed by CVD, ALD, or any suitable method. In one embodiment, the high-k dielectric layer 136 is formed using a highly conformal deposition process such as ALD in order to ensure the formation of a gate dielectric layer having a uniform thickness around each semiconductor nanosheet 114. It is understood that other materials and deposition processes may be used for the formation of the high-k dielectric layer 136, without departing from the scope of the present disclosure. In some embodiments, the gate dielectric layer 136 may include two or more sub-layers of different high-k dielectric materials.

Referring to FIG. 13, after forming the high-k dielectric layer 136, a first metallic layer 138 is formed on the high-k dielectric layer 136 filling into the gate trenches G1 and filling into the cavities C1. In some embodiments, referring to FIG. 13, the first metallic layer 138 formed directly on the high-k dielectric layers 136 substantially fills up the trenches G1. In some embodiments, within the cavities C1, the first metallic layer 138 is formed directly on the high-k dielectric layers 136 and substantially fills up the cavities (or voids) between the complex 2D material layers 114.

In some embodiments, the first metallic layer 138 includes platinum, palladium (Pd), gold (Au), titanium (Ti), tantalum (Ta), tungsten (W), vanadium (V), niobium (Nb), nickel (Ni), aluminum (Al), bismuth (Bi), manganese (Mn), molybdenum (Mo), nitrides thereof or combinations thereof. In some embodiments, the first metallic layer 138 includes titanium nitride (TiN). In some embodiments, the first metallic layer 138 includes tantalum nitride (TaN) or nickel aluminum nitride (NiAlN). In some embodiments, the first metallic layer 138 includes tungsten. For example, the first metallic layer 138 can be deposited using physical vapor deposition (PVD), ALD, CVD, or other suitable deposition processes. In some embodiments, the first metallic layer 138 includes a layer of titanium nitride (TiN) formed by CVD or ALD. In some embodiments, the first metallic layer 138 includes a layer of tungsten formed by PVD.

Later, the extra high-k dielectric layer 136 and first metallic layer 138 are removed through a planarization process. As seen in FIG. 13, the top surfaces of the high-k dielectric layer 136 and first metallic layer 138 are substantially flush with and levelled with the top surfaces of the remained sidewall spacers 125, and substantially flush with and levelled with the top surface(s) of the ILD layer(s) 132.

After the formation of the high-k dielectric layer 136 and the first metallic layer 138, the cavities C1 between the complex 2D material layers 114 in the sheet stacks 110P are filled and the trenches G1 are filled. In some embodiments, as seen in FIG. 13, the high-k dielectric layer 136 and the first metallic layer 138 filled in the cavities C1 function as the gate electrodes and are referred to as the lower gate electrodes or inner gates 140I, and the high-k dielectric layer 136 and the first metallic layer 138 filled in the trenches G1 also function as the gate electrodes and are referred to as top gate electrodes or outer gates 140E. Collectively, the top gate electrode 140E and the lower electrodes 140I form a gate structure 140.

Figure 14:
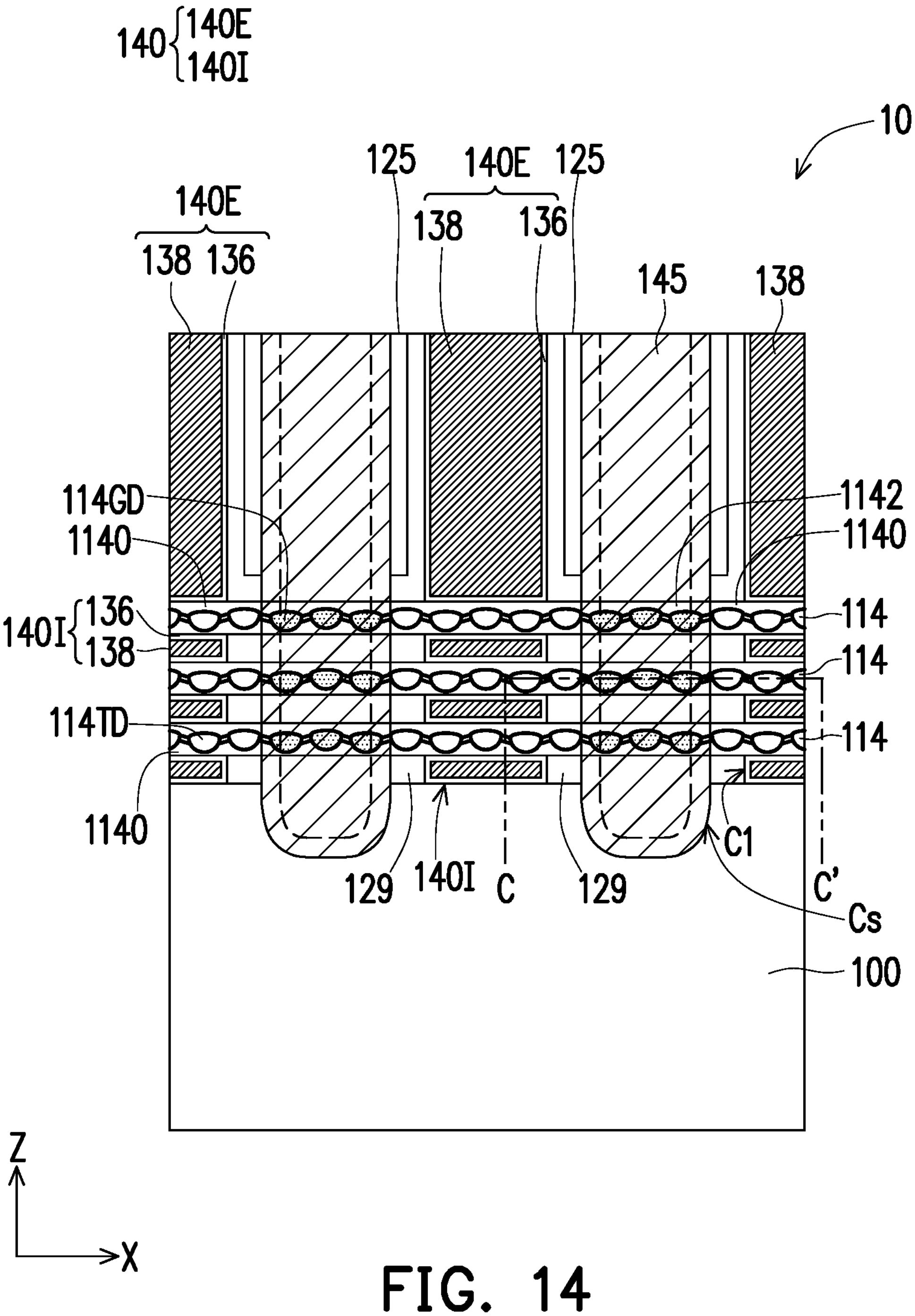

As seen in FIG. 14, in some embodiments, the ILD layer(s) 132 is removed, and then source and drain regions 130 are formed between the sidewall spacers 125 and the inner spacers 129, thus obtaining the semiconductor device 10. After removing the ILD layer(s) 132, source and drain regions 145 are formed by forming a metallic material to fill up the openings S1 and the cavities Cs beside the inner spacers and fill up the space between the sidewall spacers 125. In some embodiments, the source and drain regions 145 cover and wrap the portions 1142 of the complex 2D material layers 114, and the atoms 114GD (e.g. graphene) of the portions 1142 are embedded within the source and drain regions 145.

As seen in FIG. 14, the complex 2D material layers 114 are shaped as parallel sheets extending the source and drain regions 145 and are wrapped around by the gate structures 140 (gate electrodes 140E/140I). In some embodiments, the first portions 1140 that extend between the source and drain regions 145 and function as channel regions are joined with the second portions 1142 that are embedded within the source and drain regions 145. In some embodiments, the source and drain regions 145 are formed by forming a metallic material layer including Ti, W, Bi, antimony (Sb), cobalt (Co), V, Nb, Mn, Mo, tantalum (Ta), nitrides thereof or combinations thereof. In some embodiments, the formation of the metallic material layer includes forming a composite structure of a titanium nitride (TiN) layer and a tungsten (W) layer. For example, the metallic material layer may be deposited using physical vapor deposition (PVD), ALD, CVD, or other suitable deposition processes. In some embodiments, the source and drain regions 145 are formed by forming a layer of titanium nitride (TiN) by CVD or ALD and then filling up the spaces/voids by forming tungsten by PVD.

Optionally, the source and drain regions 145 may be further formed with dopants for N-type or P-type transistors.

Figure 15:
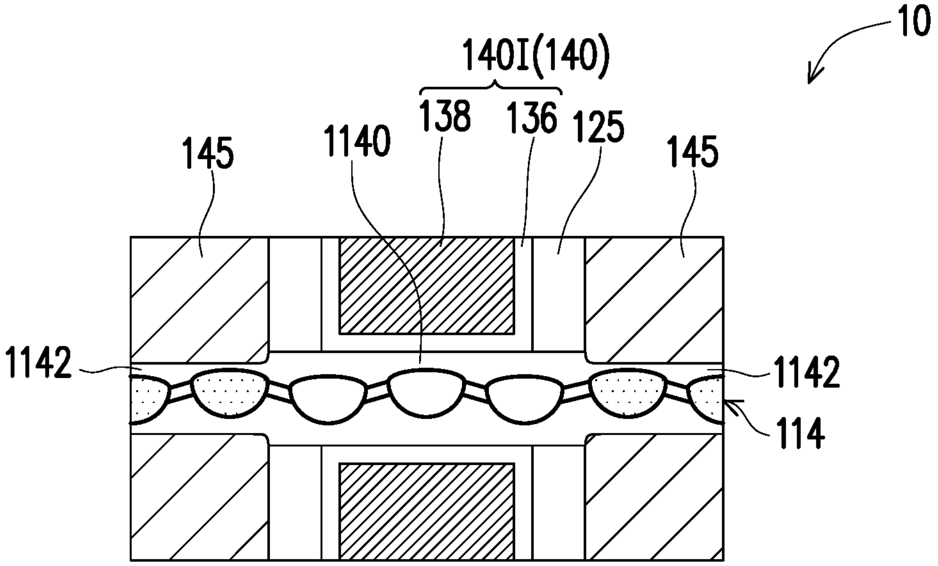
FIG. 15 is a schematic cross-sectional view of a portion of a semiconductor device in accordance with some embodiments of the disclosure.

FIG. 15 is a schematic cross-sectional view of a portion of the semiconductor device as shown in FIG. 14 along the cross-sectional line C-C' in accordance with some embodiments of the disclosure.

Referring to FIG. 14 and FIG. 15, for the semiconductor device 10, the gate structure 140 including the lower gate electrodes 140I and the top gate electrode 140E (composed of the high-k dielectric layers 136 and the metallic layer 138) wraps and surrounds the channel regions 1140 of the complex 2D material layers 114. In some embodiments, the complex 2D material layers 114 (as nanosheets) extend beyond the gate structure 140 and extend into (inserted into) the source and drain regions 145, with the portions 1142 embedded within the source and drain regions 145. From the schematic top view (along C-C' cross-section) of FIG. 15, the channel portions 1140 are covered by the gate structure 140 and the sidewall spacers 125. In some embodiments, the gate structure 140, especially the high-k dielectric layer 136, directly contacts the sidewall spacers 125 and the channel portions 1140 and wraps the channel portions 1140. The source and drain regions 145 are located on opposite sides of the gate structure 140 and beside the sidewall spacers 125. Also, the source and drain region 145 contacts and wraps around the extended portions 1142 of the complex 2D material layers 114. In some embodiments, the complex 2D material layers 114 is formed with the dual 2D material, the channel portions 1140 of the complex 2D material layers 114 contain TMDs and the extended portions of the complex 2D material layers 114 contain graphene. From FIG. 14 an FIG. 15, the source and drain regions 145 are in contact with both of the channel portions 1140 and the extended portions 1142 of the complex 2D material layers 114. In some embodiments, the semiconductor device 10 includes nanosheet transistors. In some embodiments, the semiconductor device 10 includes gate all around transistors.

In the exemplary embodiments, the formation of the complex 2D material layer(s) results in the transistors having channel region(s) made of high quality TMDs and source and drain regions (or terminals) embedded with semi-metallic graphene, which leads to transistors with better performance and lower contact resistance. In addition, the formed metallic stacks (as the source and drain terminals) not only has lower resistance itself but also reduce the resistance between the contacts and the source and drain terminals.

In the above-mentioned embodiments, through the graphene-assisted formation process, the dual 2D material layer(s) or complex 2D material layer(s) including the joined TMDs and graphene are formed with high quality and may be formed and stacked in alternation with other material layers to form a stacked structure. Further, selected 2D materials may be formed in predetermined regions for later-to-be-formed channel layer(s) and the source and drain terminals. The complex 2D material layers with joined TMDs and graphene help to establish good contact schemes and lower the contact resistance. In addition, as the formation of the channel region(s) between the source and drain terminals is performed on-site in a self-aligned way, the formation of the channel region(s) can be appropriately controlled and the yield is improved. Overall, the performance of the FET device is also enhanced.

In the illustrated embodiments, the described methods and structures may be formed compatible with the current semiconductor manufacturing processes. In exemplary embodiments, the described methods and structures are formed during front-end-of-line (FEOL) processes. The illustrated structure of transistor(s) 10 may be a portion of integrated circuits. In some embodiments, the illustrated structure may include active devices such as thin film transistors, high voltage transistors, passive components, such as resistors, capacitors, inductors, fuses, and/or other suitable components. In some embodiments, additional steps may be provided before, during, and after the process steps depicted above, and some of the steps described above may be replaced or eliminated, for additional embodiments of the method.

In some embodiments of the present disclosure, a semiconductor device structure is described. The semiconductor device includes a substrate, complex two-dimensional material layers disposed over the substrate, a gate structure and source and drain regions. The complex two-dimensional material layers are arranged spaced apart from one each other and in parallel to one another. The gate structure is disposed across and wraps around and surrounds first portions of the complex two-dimensional material layers. The source and drain regions are disposed on opposite sides of the gate structure and wrap around and surround second portions of the complex two-dimensional material layers.

In some embodiments of the present disclosure, a structure includes a substrate, complex two-dimensional material sheets disposed over the substrate, a gate structure and metallic source and drain regions. The complex two-dimensional material sheets are disposed over the substrate, arranged in parallel and are spaced apart from one another. The complex two-dimensional material sheets include channel portions and extended portions extending from the channel portions, and the channel portions are made of a first two-dimensional material different from a second two-dimensional material of the extended portions. The gate structure is disposed across and between the channel portions of the complex two-dimensional material sheets, and wraps the channel portions of the complex two-dimensional material sheets. Spacers are disposed on opposite sides of the gate structure. The metallic source and drain regions are disposed on opposite sides of the gate structure and beside the spacers. The extended portions of the complex two-dimensional material sheets are embedded within the metallic source and drain regions.

In some embodiments of the present disclosure, a method for forming a semiconductor device is described. After providing a substrate, a stack having sacrificial material layers and complex two-dimensional material layers in alternation is formed over the substrate. A dummy structure is formed on the stack. The dummy structure includes a dummy stack and sidewall spacers disposed on sidewalls of the dummy stack. The stack is patterned using the dummy structure thereon as a mask to form openings by removing portions of the sacrificial material layers without removing the complex two-dimensional material layers. The openings are filled with a dielectric material. The dummy stack is removed to form a gate trench between the sidewall spacers. The sacrificial material layers are removed to form cavities. A gate structure is formed filling into the gate trench and filling into the cavities. The dielectric material filled in the openings is removed. Source and drain regions are formed in the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

complex two-dimensional material layers disposed over the substrate, wherein the complex two-dimensional material layers are arranged spaced apart from one each other and in parallel to one another;

a gate structure, disposed across and wrapping around and surrounding first portions of the complex two-dimensional material layers; and source and drain regions, disposed on opposite sides of the gate structure and wrapping around and surrounding second portions of the complex two-dimensional material layers, wherein the first portions of the complex two-dimensional material layers include a transition metal dichalcogenide material, and the second portions of the complex two-dimensional material layers include graphene.

2. The device of claim 1, wherein the transition metal chalcogenide material includes a transition metal selected from molybdenum (Mo) or tungsten (W), and a chalcogen selected from sulfur (S), selenium (Se) or tellurium (Te).

3. The device of claim 1, wherein the source and drain regions include a metallic material selected from titanium, tungsten, cobalt, vanadium, niobium, manganese, molybdenum, tantalum, nitrides thereof or a combination thereof.

4. The device of claim 1, further comprising sidewall spacers disposed between the gate structure and source and drain regions.

5. The device of claim 4, wherein each of the sidewall spacers includes a first spacer and a second spacer disposed on the first spacer, and the second spacer is made of a material different from that of the first spacer.

6. The device of claim 4, wherein the gate structure includes a gate dielectric layer and a gate metallic layer, and the gate dielectric layer is in contact with the sidewall spacers.

7. The device of claim 1, further comprising lateral inner spacers located between the gate structure and the source and drain regions.

8. A structure, comprising:

a substrate;

complex two-dimensional material sheets, disposed over the substrate, arranged in parallel and spaced apart from one another, wherein the complex two-dimensional material sheets include channel portions and extended portions extending from the channel portions, and the channel portions are made of a first two-dimensional material different from a second two-dimensional material of the extended portions;

a gate structure, disposed across and between, and wrapping the channel portions of the complex two-dimensional material sheets;

spacers disposed on opposite sides of the gate structure; and metallic source and drain regions, disposed on opposite sides of the gate structure and beside the spacers, wherein the extended portions of the complex two-dimensional material sheets are embedded within the metallic source and drain regions.

9. The structure of claim 8, wherein the first two-dimensional material of the channel portions includes a transition metal dichalcogenide material, and the second two-dimensional material of the extended portions includes graphene.

10. The structure of claim 9, wherein the transition metal chalcogenide material includes a transition metal selected from molybdenum (Mo) or tungsten (W), and a chalcogen selected from sulfur (S), selenium (Se) or tellurium (Te).

11. The structure of claim 8, wherein the metallic source and drain regions include a metallic material selected from titanium, tungsten, cobalt, vanadium, niobium, manganese, molybdenum, tantalum, nitrides thereof or a combination thereof.

12. The structure of claim 11, wherein each of the metallic source and drain regions includes a composite structure of a titanium nitride layer and a tungsten layer.

13. The structure of claim 8, wherein the channel portions are covered by the gate structure and the spacers.

14. The structure of claim 13, each of the spacers includes a first sub-spacer and a second sub-spacer disposed on the first sub-spacer, and the first and second sub-spacers are of different materials.

15. A structure, comprising:

a substrate;

complex two-dimensional material sheets, disposed over the substrate, arranged in parallel and spaced apart from one another, wherein the complex two-dimensional material sheets include channel portions and extended portions extending from the channel portions, and the channel portions are made of a first two-dimensional material different from a second two-dimensional material of the extended portions;

a gate structure, disposed across and between, and wrapping the channel portions of the complex two-dimensional material sheets, wherein the gate structure includes a gate dielectric layer and a gate metallic layer;

spacers disposed on opposite sides of the gate structure; and metallic source and drain regions, disposed on opposite sides of the gate structure and beside the spacers, wherein the extended portions of the complex two-dimensional material sheets are embedded within the metallic source and drain regions.

16. The structure of claim 15, wherein the first two-dimensional material of the channel portions includes a transition metal dichalcogenide material, and the second two-dimensional material of the extended portions includes graphene.

17. The structure of claim 16, wherein the transition metal chalcogenide material includes a transition metal selected from molybdenum (Mo) or tungsten (W), and a chalcogen selected from sulfur (S), selenium (Se) or tellurium (Te).

18. The structure of claim 17, wherein the metallic source and drain regions include a metallic material selected from titanium, tungsten, cobalt, vanadium, niobium, manganese, molybdenum, tantalum, nitrides thereof or a combination thereof.

19. The structure of claim 18, wherein each of the metallic source and drain regions includes a composite structure of a titanium nitride layer and a tungsten layer.

20. The structure of claim 15, wherein the channel portions are covered by the gate structure and the spacers, and the extended portions are wrapped by the source and drain regions.

* * * * *